(12) United States Patent
Bellan et al.

(10) Patent No.: US 8,486,348 B2
(45) Date of Patent: Jul. 16, 2013

(54) CHANNEL AND METHOD OF FORMING CHANNELS

(75) Inventors: Leon M. Bellan, Somerville, MA (US); Harold G. Craighead, Ithaca, NY (US); Elizabeth A. Strychalski, North Potomac, MD (US)

(73) Assignee: Cornell University, Ithaca, NY (US)

( * ) Notice: Subject to any disclaimer, the term of this patent is extended or adjusted under 35 U.S.C. 154(b) by 103 days.

(21) Appl. No.: 12/914,675

(22) Filed: Oct. 28, 2010

(65) Prior Publication Data

US 2012/0107194 A1 May 3, 2012

(51) Int. Cl.
*B29C 67/20* (2006.01)
*D06M 10/00* (2006.01)

(52) U.S. Cl.
USPC ............. 422/502; 422/544; 264/49; 264/129; 264/134; 264/241; 264/294; 264/299; 264/304; 264/464; 264/465; 264/466; 264/484; 427/180; 977/788; 977/888; 977/890; 977/892

(58) Field of Classification Search
None
See application file for complete search history.

(56) References Cited

U.S. PATENT DOCUMENTS

| | | | |
|---|---|---|---|
| 6,621,076 B1 | 9/2003 | Van de Goor et al. | |
| 7,686,907 B1 * | 3/2010 | Woolley et al. | 156/155 |
| 8,354,052 B1 * | 1/2013 | Guenthner et al. | 264/465 |
| 2003/0087198 A1 * | 5/2003 | Dharmatilleke et al. | 430/320 |
| 2005/0051518 A1 * | 3/2005 | Vitello et al. | 217/27 |
| 2005/0123688 A1 * | 6/2005 | Craighead et al. | 427/469 |

FOREIGN PATENT DOCUMENTS

| | | |
|---|---|---|
| WO | WO-2009137038 A2 | 11/2009 |
| WO | WO-2009137038 A3 | 6/2010 |

OTHER PUBLICATIONS

L.M. Bellan et al., Nanochannels fabricated in polydimethylsiloxane using sacrificial electrospun polyethylene oxide nanofibers, Sep./Oct. 2008, J. of Vacuum Science and Technology B, v. 26 No. 5, pp. 1728-1731.*
S. Lee et al., Chip-tochip fluidic connectors via near-field electrospinning, IEEE, Micro Electro Mechanical Systems, Jan. 21-25, 2007, p. 61-64.*
S. Lee et al., Micro Electro Mechanical Systems, 2007, IEEE 20th International Conference, Kobe, Japan, Jan. 21-25, 2007, pp. 61-64.*
"Fabrication of SU-8 embedded microchannels with circular cross-section", International Journal of Machine Tools & Manufacture, vol. 44, No. 10 (Aug. 2004).
"Nanofluidic channels with elliptical cross sections formed using a nonlithographic process", Applied Physics Letters AIP USA, vol. 83, No. 23, XP002575132, (Dec. 8, 2003), 4836-4838 Pages.

(Continued)

*Primary Examiner* — Jill Warden
*Assistant Examiner* — Timothy G Kingan
(74) *Attorney, Agent, or Firm* — Schwegman, Lundberg & Woessner, P.A.

(57) ABSTRACT

A device is made by forming sacrificial fibers on a substrate mold. The fibers and mold are covered with a first material. The substrate mold is removed, and the covered fibers are then removed to form channels in the first material.

6 Claims, 6 Drawing Sheets

OTHER PUBLICATIONS

"Suspended glass nanochannels coupled with microstructures for single molecule detection", Journal of Applied Physics, vol. 97 (Jun. 29, 2005), 124317-1-124317-4 pages.

"International Application Serial No. PCT/US2009/002774, International Preliminary Report on Patentability mailed Aug. 24, 2010", 9.

"International Application Serial No. PCT/US2009/002774, Search Report mailed Apr. 29, 2010", 4.

"International Application Serial No. PCT/US2009/002774, Written Opinion mailed Apr. 29, 2010", 8.

\* cited by examiner

US 8,486,348 B2

CHANNEL AND METHOD OF FORMING CHANNELS

GOVERNMENT FUNDING

The invention described herein was made with U.S. Government support under Grant Number HRD-0630456 awarded by the National Science Foundation. The United States Government has certain rights in the invention.

RELATED APPLICATION

This application is a U.S. National Stage Filing under 35 U.S.C. 111(a) from International Patent Application Serial No. PCT/US2009/002774, filed May 5, 2009, and published on Nov. 12, 2009 as WO 2009/137038 A1, which claims priority to U.S. Provisional Application Ser. No. 61/050,510 (entitled NONLITHOGRAPHIC FABRICATION OF FLUIDIC CHANNELS USING ELECTROSPUN FIBERS, filed May 5, 2008) which is incorporated herein by reference.

BACKGROUND

As the technology required to observe single molecules has developed, so have methods to isolate and manipulate single molecules in fluid. Microfluidics and nanofluidics have allowed enhanced control over individual biomolecules, enabling new methods for biomolecular analysis that exploit phenomena unique to miniaturized fluidic devices. As fluidic technology moves towards smaller volumes, there is increased need for rapid and inexpensive methods to fabricate micro- and nanofluidic devices.

Prior methods of forming nanofluidic channels include the use of photolithography systems, electron beam lithography tools, and focused ion beams. All of these techniques may be slow and expensive, and utilize clean-room facilities and toxic chemicals. Photolithography tools capable of patterning such small dimensions range in price from hundreds of thousands to several million dollars, while focused ion beam systems typically cost at least $1 million and electron beam lithography systems typically cost at least $2 million. Both photolithography and electron beam lithography are multi-step techniques that require at least a resist coating step, an exposure step, and a development step.

DETAILED DESCRIPTION

Figure 1A:
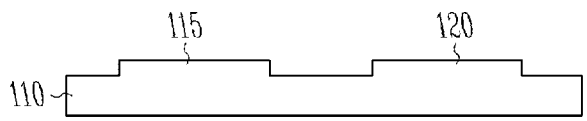
FIGS. 1A, 1B, 1C, 1D, 1E, 1F, 1G and 1H are block cross sections illustrating the forming of channels according to an example embodiment.
Figure 1B:
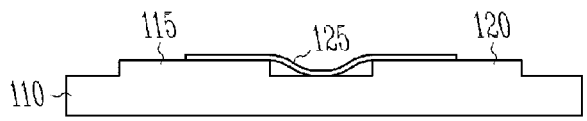

In the following description, reference is made to the accompanying drawings that form a part hereof, and in which is shown by way of illustration specific embodiments which may be practiced. These embodiments are described in sufficient detail to enable those skilled in the art to practice the invention, and it is to be understood that other embodiments may be utilized and that structural, logical and electrical changes may be made without departing from the scope of the present invention. The following description of example embodiments is, therefore, not to be taken in a limited sense, and the scope of the present invention is defined by the appended claims.

Electrospun fibers may be used as sacrificial templates to form channels. In one embodiment, the fibers are nanofibers formed of polyethylene oxide (PEO), and they are formed in a device body such as polydimethylsiloxane (PDMS). By depositing fibers on silicon substrates incorporating larger structures, the channels may be integrated easily with microfluidics. In further embodiments, many other polymers may be used for both the sacrificial template and the bulk substrate.

Hybrid micro- and nanofluidic PDMS structures may be used for single molecule observation and manipulation. In one embodiment, the structures are suitable for use with single molecules of DNA in the channels. The method of forming channels allows the simple construction of integrated micro- and nanofluidic PDMS structures without lithographic nanofabrication techniques. Many other uses may be provided by the channels, including vascularized tissue implants, inverse filter mats, sensing applications, biomolecular analysis, separation and mixing, self-healing materials and micro/nano particle sorting and filtration. In still further embodiments, color-changing materials may be used, internally heated/cooled materials may also be used. Drug delivery application may be made by forming nanochannels in a material, filling the nanochannels with a solution containing one or more drugs, putting the material on/in a patient. Drugs may be delivered by exposed nanochannels from source inside all nanochannels.

In one embodiment, the method of forming channels includes depositing a sacrificial nanofiber layer over a substrate mold using an electrospinning source, pouring a polymer resin over the nanofiber template, allowing the resin to cure, removing the mold and template material, and final assembly of the device.

PDMS remains one of the most popular materials used to fabricate micro- and nanofluidic structures. It is relatively inexpensive, easily and quickly molded, nontoxic, and transparent. The mechanical flexibility of PDMS lends itself to the construction of integrated valves and pumps, as well as the controlled and reversible deformation of device channels using external forces.

In one embodiment, the fibers are formed by the use of an electrospinning-based technique. Electrospinning is a method for forming fibers, such as nanofibers, that uses an electrically driven fluid jet to produce solid fibers from a polymer dissolved in solvent. In one embodiment, a droplet of dissolved polymer solution is supplied to a sharp electrified tip. Under the influence of an electric field between the electrified tip and a grounded substrate on which a fiber is to be formed, the droplet forms a cone from which a fluid jet emerges. This jet is accelerated towards the grounded substrate. The solvent evaporates as the jet travels, producing a solid fiber.

Although standard electrospinning systems produce a jet that exhibits a bending instability that results in the deposition of a random mat of fibers, systems have been developed to allow more controlled deposition. Several studies have demonstrated applications that exploit either fiber mats or single fibers. Electrospun nanofibers have also been used as nano-lithographic masks for patterning features in silicon wafers and thin films. A previous study has demonstrated the use of sacrificial heat-decomposable electrospun nanofibers to form nanochannels using spin-on-glass as a capping layer.

In one embodiment, the fabrication of the channels need not utilize clean-room processes, heat treatment, or specialized equipment. The resulting device is contained in a flexible substrate and may be capped by either another flexible PDMS layer or a stiff glass coverslip. The further PDMS layer or coverslip may be used to provide at least one side wall of selected portions of the nanochannels. Moreover, the PDMS layer is reusable, given that it is not bonded irreversibly to a capping layer.

Using this technique, it is possible to fabricate a complex random mat of interlinked nanochannels or an aligned array of nanochannels, such as by creating relative movement between the substrate and the tip of the electrospray device. The nanochannel pattern in one embodiment depends solely on the pattern of the electrospun nanofibers. By depositing fibers on patterned silicon substrate molds, devices incorporating both microfluidic and nanofluidic structures can be easily produced.

FIGS. 1A, 1B, 1C, 1D, 1E, 1F, and 1H illustrate cross section block diagrams of a method of forming channels according to an example embodiment. A substrate 110 may be patterned in one embodiment, forming a mold. The substrate may be formed of silicon or other suitable material, and patterned with reservoir material 115, 120 using contact photolithography and deep reactive ion etching. Other method may be used to form the mold, and many different patterns may be used, including unpatterned substrates. In FIG. 1A, the reservoir material 115 and 120 will be removed in further processing to create reservoirs. The material for substrate 110 should be selected to facilitate such removal. The patterned features may be large relative to the channels to be formed. Such large features do not need to utilize expensive patterning equipment.

A sacrificial fiber 125 is formed between the reservoir material 115, 120. Fiber 125 is formed of a material to be sacrificed to form a channel. The fiber 125 in one embodiment may be formed by electrospinning a mixture of polyethylene oxide (PEO) (Acros Organics, molecular weight of 100 000) mixed in 50/50 (v/v) water/ethanol at a concentration of approximately 20%. To produce oriented nanofibers or nanofiber arrays, a scanned electrospinning method may be used, whereby the collecting substrate is rotated quickly through the jet of fiber material. The solution may be electrospun onto silicon substrate 110, which in one embodiment, may be first treated with a nonstick coating, such as a Sigmacote (Sigma) nonstick coating. While the sacrificial fiber 125 is shown as spanning a gap between the reservoir material 115 and 120, it may be, or need not be, touching the substrate 110 in the gap.

Figure 2:
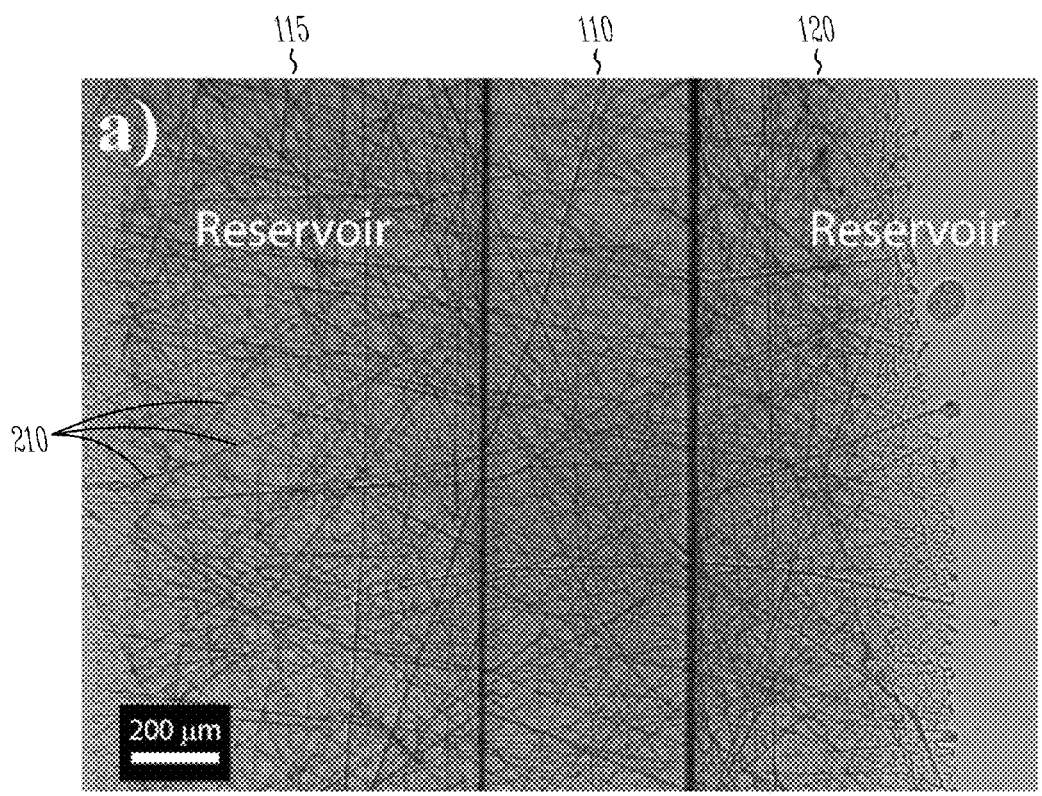
FIG. 2 is a top view of a plurality of random sacrificial fibers formed according to an example embodiment.
Figure 3:
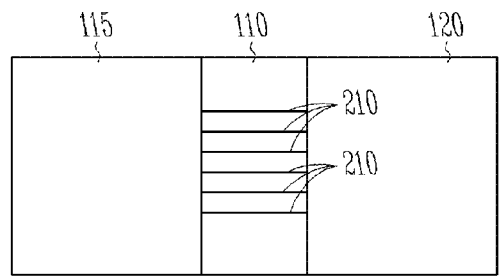
FIG. 3 is a top view of a plurality of straight channels formed according to an example embodiment.

Fiber mats 210 as shown in FIG. 2, and isolated aligned fibers 310 as shown in FIG. 3 may be deposited over selected portions of substrate 110 in various embodiments. Since the fibers are formed of a water soluble material in one embodiment, water-soaked swabs may be used to wipe away undesired polymeric material to leave a desired number or pattern of fibers, as illustrated in FIG. 3 such that the fibers extend between the reservoir regions 115, 120.

Figure 1C:
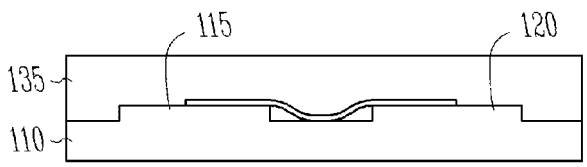

In FIG. 1C, a device layer 135 is formed over the substrate 110 and fiber or fibers. In one embodiment, layer 135 formed of PDMS Sylgard 184, from Dow Corning, which may be mixed at a 1:5 hardener-to-resin ratio, degassed, poured over the fiber-coated silicon, and degassed again. The PDMS may be allowed to cure at room temperature overnight. In one embodiment, the cure is not done at an elevated temperature to avoid melting the PEO fibers.

Figure 1D:
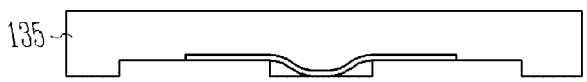
Figure 1E:
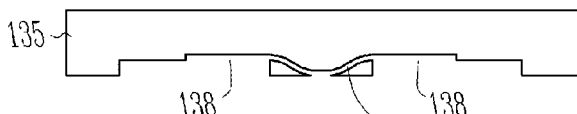
Figure 1F:
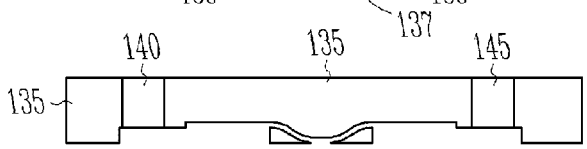

In FIG. 1D, after the PDMS device layer 135 is cured, a scalpel may be used to release devices from the silicon substrate 110. The PDMS device layer 135 is flexible and may be peeled off of the silicon substrate 110, sonicated in de-ionized water for 30 min, and allowed to soak in water overnight in order to dissolve away the PEO fibers inside the PDMS device layer 135 as shown in FIG. 1E, forming one or more channels 137 and reservoirs 138. By dissolving in water, the PEO fibers are essentially liquefied for removal.

In a further embodiment, the fibers may be heated to convert them from solid to a liquid melt, and removed, leaving nanochannels. Thus, in both embodiments, the nanofibers may be removed in liquid form. The material for forming the fiber may be selected to facilitate such liquefaction and removal, yet remain compatible with the device layer 135 material.

In still a further embodiment, the fibers may be heated to convert them from solid to vapor form. In vapor form, the polymer macromolecules are still intact, and may be easily removed. Whether dissolved, converted to liquid melt, or vaporized, the polymer forming in the nanofibers may not be depolymerized, and the macromolecules may not be degraded.

In still further embodiments, a fluid is used to facilitate the removal of the fibers. The fibers may be removed by contacting them with a fluid to form channels in the first material. As described above, water may be used to dissolve the fiber material in one embodiment. A heated gas may also be used to liquefy or vaporize the fiber, facilitating removal. In still further embodiments, a fluid that reacts with the fibers to remove them may be used. Depending on the fiber material used, various acids may be used to remove them.

Figure 1G:
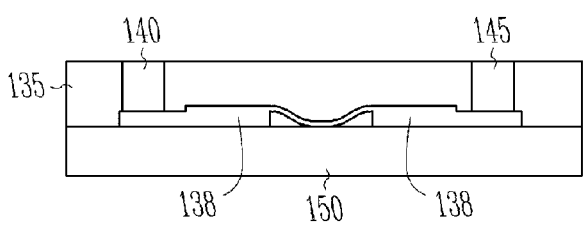
Figure 1H:
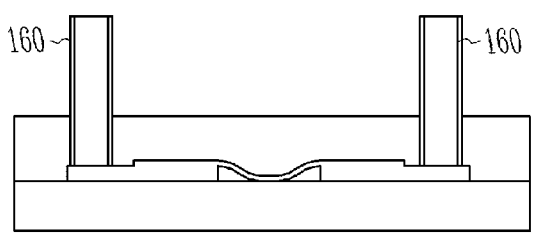

The PDMS may then be dried and access holes 140, 145 may be created using a metal punch or by other suitable means to provide fluidic access to the resulting reservoirs. Finally, the PDMS may be exposed to an oxygen plasma for approximately 30 seconds and bonded irreversibly to a glass coverslip 150 as illustrated in FIG. 1G. The glass coverslip 150 may be used as a device capping layer. In one embodiment, the capping layer provides at least one side wall of selected portions of the channel 137 or channels and reservoirs 138.

In a further embodiment, fluidic access to reservoirs 138 may be provided through tubing 160, or other larger channels that may be formed, likely having features much larger than nanoscale to allow filling and removal of fluid from the reservoirs 138 during use. In one embodiment, the larger channels providing access to the reservoirs may be provided on the patterned substrate 110, such that the device layer 135 when combined with the coverslip 150 provide access to the reservoirs 138.

In one embodiment, the device at this stage of the fabrication process consists of two large reservoirs connected by a fiber mat. Fibers present in the reservoirs formed features embedded in the reservoir ceiling and did not result in enclosed nanochannels after bonding. Channels may be formed with diameters ranging from several microns to under 30 nm, depending on the materials used. The fabrication process is simple, fast, and inexpensive. To produce random nanochannel patterns, a fluid source and a high voltage supply may be used. In further embodiment, controlled electrospinning deposition may be used to produce aligned mats or single-fiber patterns that may be easily applied to exert control over the channel geometry.

The method of forming channels may be easily scaled up to achieve the demand that may be required by industrial and commercial applications of fluidic systems. Because electrospinning can produce fibers and nanofibers from essentially any polymer, a wide range of material systems may be used for either the sacrificial template or the bulk channel-containing material. Post processing steps such as etching of the deposited fibers, growth supported by the deposited fibers, or etching of the channels may allow another degree of control over the channel diameters.

Control of the electrospinning process can provide significant variations in the fibers. Some variables that may be modified include the pressure at which fibers are deposited and variation in temperature at which fibers are deposited. The pattern of fibers deposited may be varied by controlling the electrospinning technique. Melt electrospinning or in-flight polymerization electrospinning may be used. Post processing of fibers or channels may be used to change channel diameter. In further embodiments, the method may be used to make nanochannels for single molecule analysis, micro- and nanoparticle sorting and filtration, biomolecule analysis and manipulation, self-healing materials, mixing for microfluidics, and other applications.

Many different device geometries may be fabricated. Fiber mats may be formed on unpatterned silicon chips. Such devices may consist solely of a large network of nanochannels accessed by tubing attached to holes punched in the PDMS.

Nanofiber mats may be deposited onto silicon chips containing etched features. This may be used to produce devices that incorporate both microfluidic and nanofluidic structures. In this way, a multilevel PDMS fluidic structure may be created without the need for multiple layers of lithography.

Because electrospinning produces fibers with a range of sizes (diameters varying up to approximately 50% from the average value), the resulting nanochannels exhibit a similarly broad range of diameters.

In one embodiment, mats of fibers may have an average diameter of 455-146 nm. By tuning the properties of the electrospinning solution (such as polymer concentration, polymer molecular weight, and solvent), the resulting fiber diameters may be influenced. Tuning the parameters of the electrospinning system may also yield fibers with a narrower diameter distribution. In one embodiment, electrospinning may be able to produce nanofibers with diameters below 30 nm. Such ultrafine fibers may be used to create similarly sized channels limited by the mechanical stability of the PDMS itself. Channels produced from sacrificial fibers are roughly circular in cross section, as opposed to those with rectangular cross sections made using standard lithographic techniques.

In one embodiment, a device may designed to handle single molecule transport through one or more channels. The device consists of two large reservoirs (1 cm×0.5 cm×26 μm deep) as shown in FIG. 1G, connected by nanochannels formed from sacrificial electrospun nanofibers. The channels may be first filled with filtered 5× tris borate EDTA (TBE) buffer (Sigma) that may be introduced through one of the reservoirs. After buffer is observed exiting the opposite reservoir, a 50 ngml solution of λ bacteriophage DNA (New England Biolabs) labeled with YOYO-1 (Molecular Probes) at a nominal labeling ratio of 7.6:1 using the syringe pump. The DNA molecules traverse the channels one molecule at a time.

PDMS is an established, versatile, and easy-to-use material for the construction of miniaturized fluidic structures. PEO is a good material to electrospin because it is nontoxic, water soluble, easy to electrospin, and easy to work with. A fabrication process combining these two materials to form fluidic structures in PDMS is advantageous because the material systems involved are standard for the field and require no toxic solvents. These features render this fabrication technique potentially suitable for fabricating fluidic structures for instructional purposes. Moreover, the process described herein could easily be scaled up for mass production of PDMS substrates containing nanochannels.

The method of forming channels described may be readily adapted for use with other polymeric materials. The channels produced by these methods may be used to form paths determined by the layout of the deposited fibers. The "inverse mat" resulting from using a random fiber mat template provides a tortuous path for fluid and molecules to follow. The random fiber mat provides random branching paths would be difficult and time consuming to produce using standard lithographic techniques. Such paths may be useful for sensing, biomolecular separation, and mixing applications. Isolated nanochannels may be used for analysis of single molecules such as DNA. Such channels may be formed straight in one embodiment.

Using sacrificial electrospun PEO nanofibers as templates, formed nanofluidic channels in PDMS may be easily integrated with microfluidic features. These channels can be defined as random intersecting paths or as a set of aligned structures depending on the deposited fiber template used. Fluid and single molecules may be driven into these channels and observed. Such a high-throughput, soft lithographic technique may be used to form nanochannels easily in a wide range of materials, and thus renders several micro- and nanofluidic technologies previously confined to the research laboratory potentially commercially viable.

Figure 4:
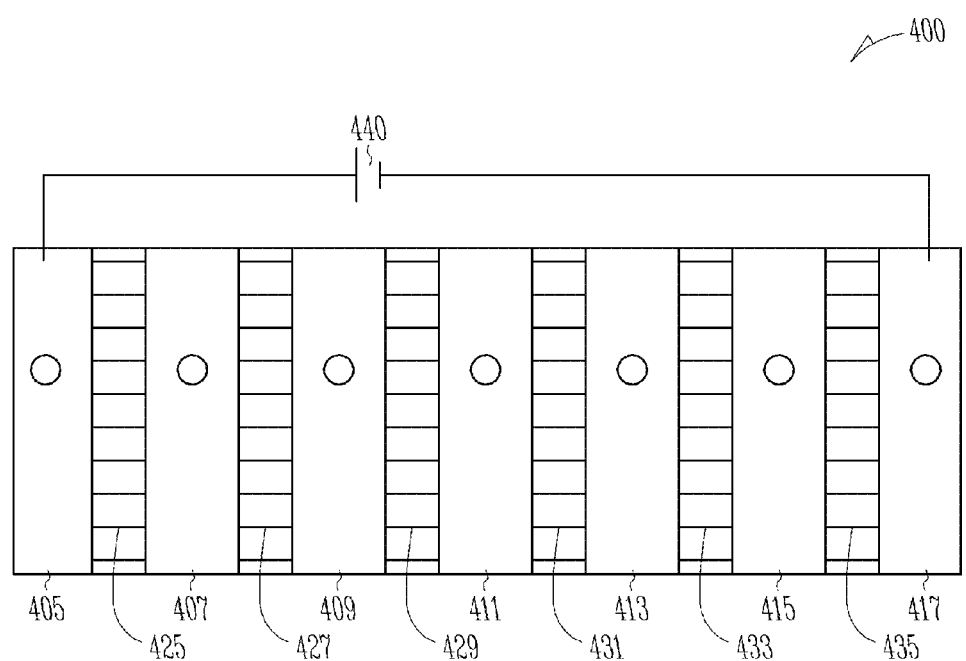
FIG. 4 is a top view of a molecule or nanoparticle sorting device formed according to an example embodiment.

FIG. 4 is a top view of a molecule or particle sorting device 400. Device 400 consists of several consecutive reservoirs 405, 407, 409, 411, 413, 415 and 417, each connected by one or more channels 425, 427, 429, 431, 433, and 435. The channels at 425 have the largest diameter, and serve to prevent passage of the largest particles or molecules. Each consecutive set of channels is successively narrower to prevent passage of particles of molecules larger than a predetermined size. In one embodiment, a voltage source 440 is coupled between reservoirs 405 and 417 to provide electromotive force assist in moving an electrolyte solution containing the particles, such as nanoparticles, or molecules through the channels. The voltage source may be pulsed in one embodiment to inhibit uncoiling of proteins and other large molecules to prevent them from traveling between the reservoirs. Each successive reservoir will end up with different size particles on conclusion of a sorting process. While the successive channels have been described as getting smaller, they may stay the same size in further embodiments to provide a longer filtering process and reduce the chances of undesired passage of larger particles or molecules.

Figure 5:
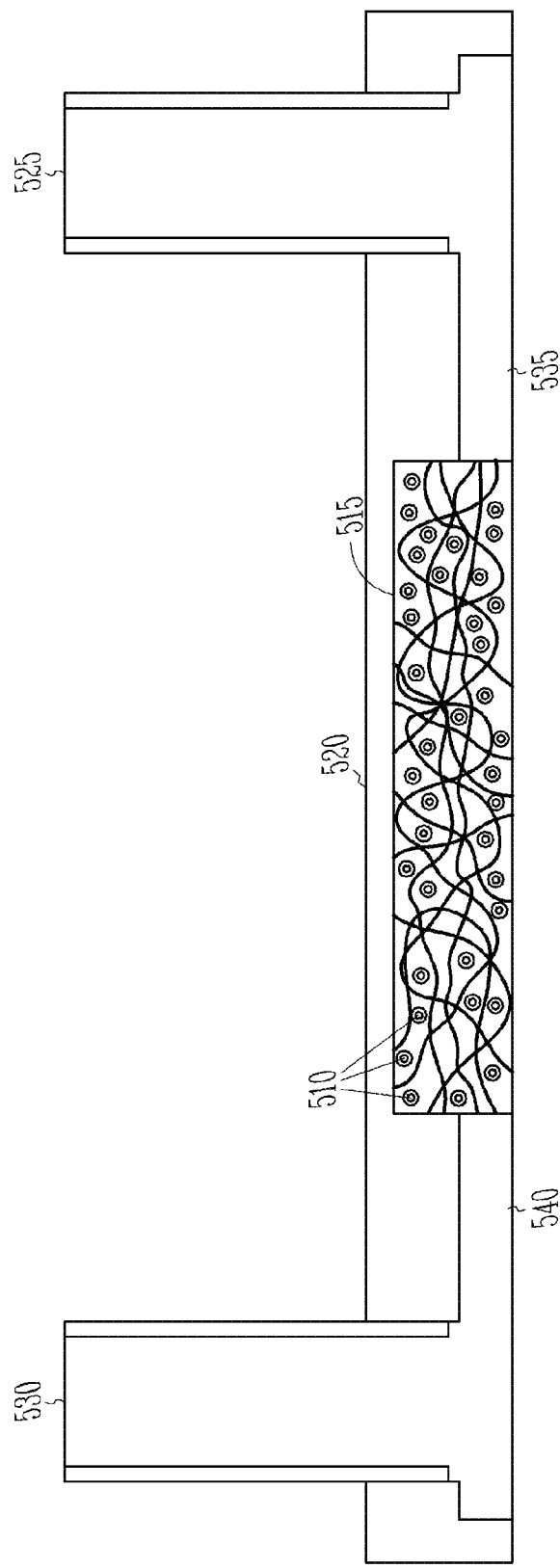
FIG. 5 is a block diagram cross section illustrating cells embedded in a nanochannel matrix according to an example embodiment.

FIG. 5 is a block diagram cross section illustrating cells 510 embedded in a nanochannel matrix 515 according to an example embodiment. In one embodiment, the cells are embedded near the channels, and may be formed following spinning of sacrificial nanofibers. In one embodiment, the cells are added during formation of the device layer such that they are dispersed throughout the device layer and at least some are proximate the resulting nanochannels. The nanochannels may be used to deliver desired fluids to the cells 510. The matrix 515 may be supported within a device 520 having a first access port 525 and second access port 530, with the matrix 515 spanning micro-channels 535, 540 coupled to the respective access ports. The ports may be used to provide and remove fluids to and from the matrix 515.

Figure 6:
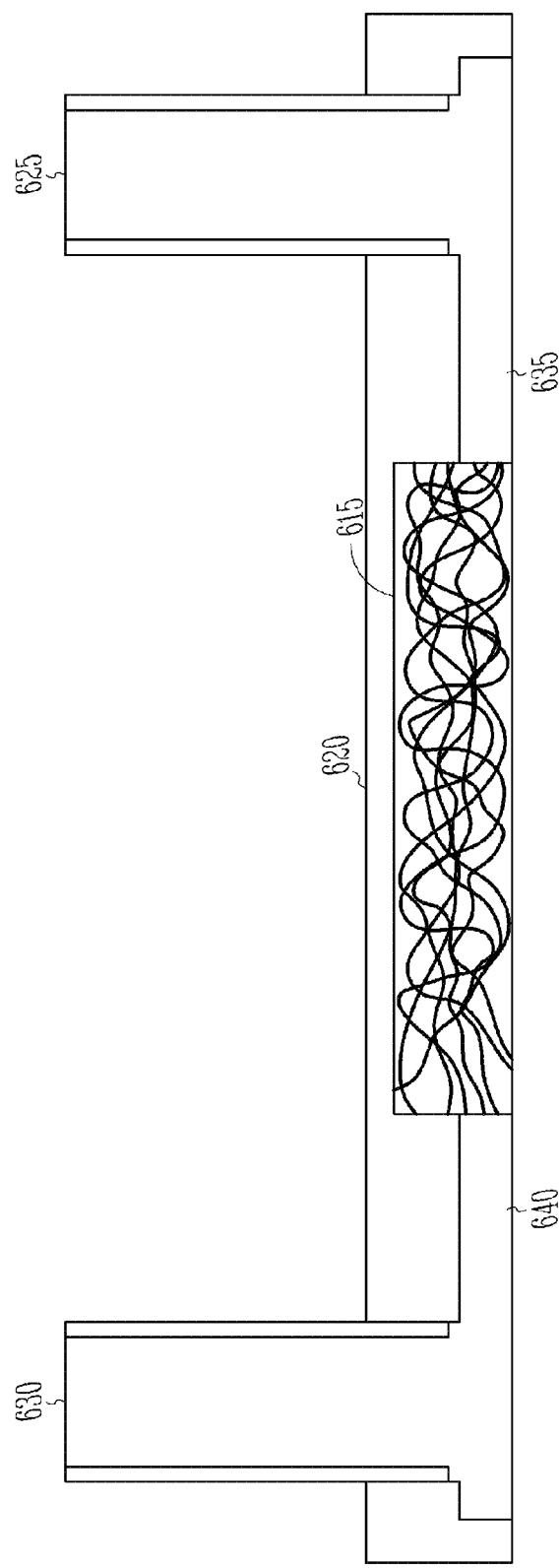
FIG. 6 is a block diagram cross section of a nanochannel matrix that is responsive to temperature of a fluid running through the nanochannels according to an example embodiment.

FIG. 6 is a block diagram cross section of a nanochannel matrix 615 that is responsive to temperature of a fluid running through the nanochannels according to an example embodiment. The matrix 615 may be supported within a device 620 having a first access port 625 and second access port 630, with the matrix 615 spanning micro-channels 635, 640 coupled to the respective access ports. The ports may be used to provide and remove fluids to and from the matrix 615. In one embodiment, the fluid is darker when cooler, as indicated in access port 630 and micro-channel 640. As the cool fluid moves through the matrix 615, it warms, and the matrix 615 takes on the appearance of the fluid, becoming lighter as seen closer to micro-channel 635 and access port 625. In further embodiments, the fluid moves in the other direction, and becomes cooler as it moves through the matrix 615.

Figure 7:
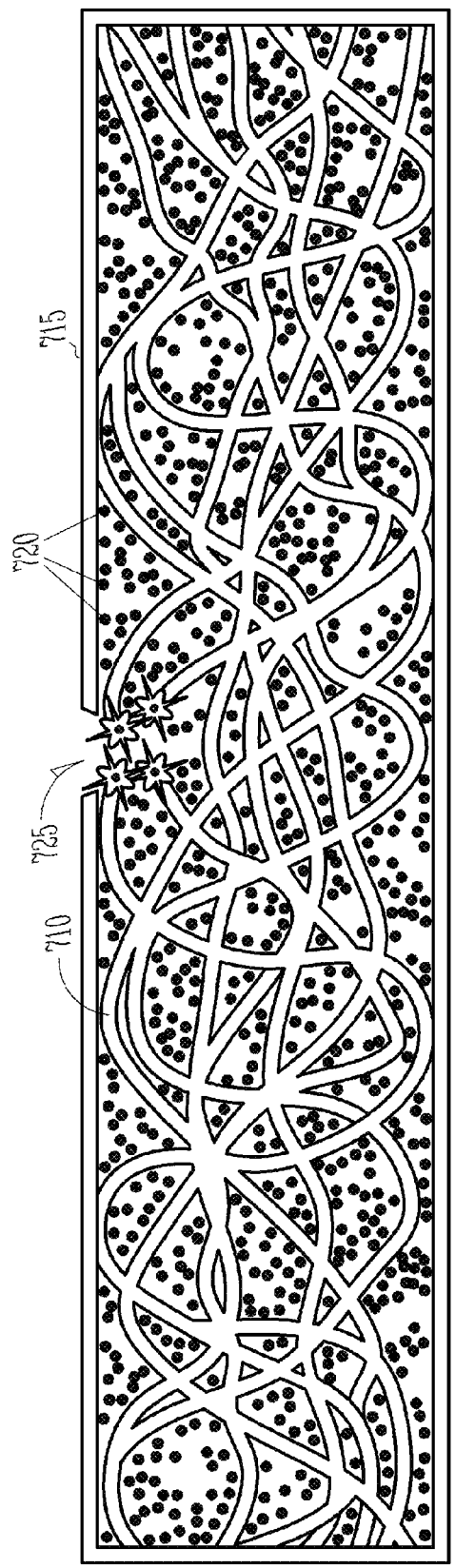
FIG. 7 is a block diagram cross section of a self healing nanochannel matrix according to an example embodiment.

FIG. 7 is a block diagram cross section of a self healing nanochannel matrix according to an example embodiment. Nanochannels, such as one indicated at 710 run through a material 715. In one embodiment, the nanochannels 710 contain a healing solution that is protected from catalyst particles 720 embedded in the material 715. When the material 715 fractures as indicated at 725, the catalyst particles 720 in nanochannels that rupture responsive to the fracture, are exposed to the healing solution, and a chemical reaction occurs. The chemical reaction serves to heal or seal the ruptured nanochannels, effectively sealing the fracture in the material 715.

The Abstract is provided to comply with 37 C.F.R. §1.72(b) to allow the reader to quickly ascertain the nature and gist of the technical disclosure. The Abstract is submitted with the understanding that it will not be used to interpret or limit the scope or meaning of the claims.

The invention claimed is:

1. A method comprising:
    forming a mold to define microfluidic structures;
    electrospinning nanofibers on the mold to connect the microfluidic structures;
    forming a resin on top of the mold and nanofibers such that at least a portion of selected nanofibers is encapsulated in the resin;
    removing the mold;
    removing the nanofibers from the resin; and
    capping the resin such that nanofibers form a fluidic connection between the microfluidic structures.

2. The method of claim 1 and further comprising coating the mold with a non-stick material prior to electrospinning the nanofibers.

3. The method of claim 1 wherein the nanofibers comprise polyethylene oxide.

4. The method of claim 1 wherein the resin comprises polydimethylsiloxane.

5. The method of claim 1 wherein the mold comprises a silicon substrate having patterned features to define two reservoirs separated by a gap.

6. A method comprising:
    forming a mold to define microfluidic structures;
    electrospinning nanofibers on the mold to connect the microfluidic structures;
    forming a resin on top of the mold and nanofibers such that at least a portion of selected nanofibers is encapsulated in the resin; and
    removing the nanofibers from the resin to form a fluidic connection between the microfluidic structures.

* * * * *